(12) United States Patent
Igarashi et al.

(10) Patent No.: US 6,984,839 B2
(45) Date of Patent: Jan. 10, 2006

(54) WAFER PROCESSING APPARATUS CAPABLE OF MAPPING WAFERS

(75) Inventors: Hiroshi Igarashi, Tokyo (JP); Tsutomu Okabe, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 320 days.

(21) Appl. No.: 10/301,841

(22) Filed: Nov. 22, 2002

(65) Prior Publication Data

US 2004/0099824 A1 May 27, 2004

(51) Int. Cl.
*G01N 21/86* (2006.01)
*G01V 8/00* (2006.01)

(52) U.S. Cl. ............... 250/559.33; 250/559.28; 250/559.4; 414/411; 414/416.03; 414/416.08; 414/937

(58) Field of Classification Search ............ 250/559.29, 250/559.33, 559.4, 221, 222.1; 414/411, 414/416.03, 416.08, 937
See application file for complete search history.

(56) References Cited

U.S. PATENT DOCUMENTS

| | | | |
|---|---|---|---|
| 6,013,920 A | | 1/2000 | Gordon et al. |
| 6,053,983 A | * | 4/2000 | Saeki et al. ............. 118/728 |
| 6,082,949 A | | 7/2000 | Rosenquist |
| 6,138,721 A | | 10/2000 | Bonora et al. |
| 6,188,323 B1 | | 2/2001 | Rosenquist et al. |
| 6,220,808 B1 | | 4/2001 | Bonora et al. |
| 6,281,516 B1 | | 8/2001 | Bacchi et al. |
| 6,452,201 B1 | * | 9/2002 | Wang et al. ........... 250/559.29 |
| 6,470,927 B2 | * | 10/2002 | Otaguro ....................... 141/98 |
| 6,655,423 B2 | * | 12/2003 | Rush et al. ................... 141/98 |
| 2003/0173511 A1 | | 9/2003 | Bacchi et al. |

FOREIGN PATENT DOCUMENTS

| | | |
|---|---|---|
| JP | 06-135506 | 5/1994 |
| JP | 8-213447 | 8/1996 |
| JP | 09-064154 | 3/1997 |
| JP | 9-237810 | 9/1997 |
| JP | 10-308438 | 11/1998 |
| JP | 11-3927 | 1/1999 |
| JP | 11-31738 | 2/1999 |
| JP | 11-087459 | 3/1999 |
| JP | 11-145244 | 5/1999 |
| JP | 11-214483 | 8/1999 |
| JP | 11-233595 | 8/1999 |
| JP | 11-251411 | 9/1999 |
| JP | 2001284439 A * | 10/2001 |

* cited by examiner

*Primary Examiner*—David Porta
*Assistant Examiner*—Davienne Monbleau
(74) *Attorney, Agent, or Firm*—Oblon, Spivak, McClelland, Maier & Neustadt, P.C.

(57) ABSTRACT

A wafer processing apparatus on which a pod having an opening is detachably mounted is provided with a door unit and a mapping unit provided with a transmitting type sensor having an emitter and a detector forming a slot therebetween. The emitter and the detector are moved toward the opening in the pod and are plunged into the interior of the pod after a door is opened by the door unit, and the slot between the emitter and the detector crosses an end portion of a wafer to thereby detect the presence or absence of the wafer. Thereby, a mechanism portion liable to produce dust which may adhere to the wafer and cause the contamination thereof can be disposed separately from the pod.

20 Claims, 10 Drawing Sheets

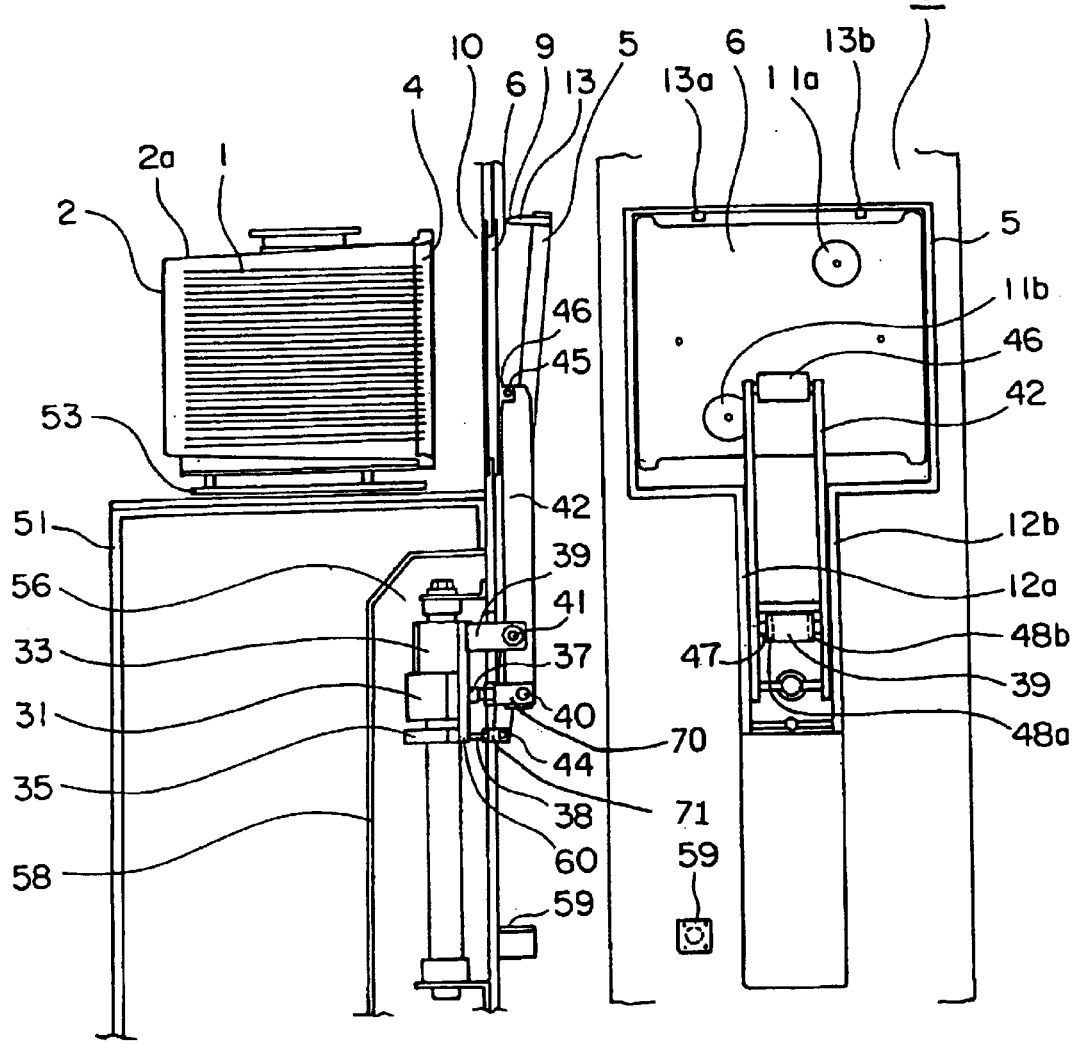

WAFER PROCESSING APPARATUS CAPABLE OF MAPPING WAFERS

BACKGROUND OF THE INVENTION

1. Field of the Invention

This invention relates to a wafer processing apparatus including a wafer mapping apparatus having a function of detecting the presence or absence of a wafer. Also, this invention particularly relates to a wafer processing apparatus for detecting the presence or absence of a wafer on each shelf of a rack (shelves) on which the wafer is placed and which is provided in the interior of a clean box for keeping a wafer in a good condition for use in a semiconductor product, a product related to an electronic part, an optical disc product or the like during the manufacture thereof.

2. Related Background Art

In recent years, in a wafer processing process in the manufacture of a semiconductor product or the like which requires a high degree of cleanness, there has been adopted a technique which does not an entire room relating to the treating process into a highly clean environment. In this technique, a small space (hereinafter referred to as minienvironment) kept highly clean is provided in each wafer processing apparatus in a wafer manufacturing process. This aims at keeping a small space only in the wafer processing apparatuses and a container (hereinafter referred to as the pod) for keeping the wafer in a good condition during the movement among those wafer processing apparatuses at a high degree of cleanness. Thereby, facility investment and facility maintenance expenses required when the entire room relating to the wafer treating process is kept in a highly clean environment are curtailed to thereby obtain the same effect as keeping the entire room relating to the wafer processing process in a highly clean environment and realize an efficient production process.

In the pod, there are disposed a rack having shelves on each of which a wafer is placed. In these shelves, wafers are contained in such a state that a shelf is allotted to a wafer. The wafers placed on the shelves are moved in each wafer processing apparatus with the movement of the pod. In some cases, however, there occurs a wafer which does not satisfy a predetermined standard in the processing process of each wafer processing apparatus, and the wafer which does not satisfy the predetermined standard is removed from the shelf in the pod. Accordingly, at the initial stage of the manufacture, each shelf of the rack (shelves) is filled with the wafer, but as each processing step of the wafer processing apparatus progresses, the number of shelves in the pod on which the wafer is absent increases.

The wafer processing apparatus automatically effects the treatment of the wafer and therefore usually it is provided with a wafer transport robot (hereinafter simply referred to as the transport robot). The transport robot gains access to a shelf of the rack in the pod, transports the wafer and executes the wafer processing process. Although a wafer to be processed is absent on that shelf, if the transport robot gains access to that shelf on which the wafer is absent in order to transport the wafer, there will occur a useless movement process from after the transport robot gains access to that shelf until it returns to its original position. Further, as such a useless movement process increases, the amount of processed wafers is reduced as a whole. So, it becomes necessary to detect the presence or absence of the wafer on each shelf of the rack in the pod in each wafer processing apparatus to thereby judge in which shelf of the shelves in the pod in each wafer processing apparatus a wafer is contained and in which shelf a wafer is not contained (mapping).

The detection of the presence or absence of the wafer for mapping will now be described with reference to FIG. 1 and FIGS. 7A and 7B to 9 of the accompanying drawings. FIG. 1 shows the whole of wafer processing apparatus 50. The wafer processing apparatus chiefly includes a load port portion 51 and a minienvironment portion 52. The load port portion 51 and the minienvironment 52 are partitioned by a partition 55 and a cover 58. A stand 53 is disposed on the load port portion 51. A pod 2 can be placed on and fixed to the stand 53. The stand 53 is movable on the load port portion 51 toward or away from the minienvironment 52 side. The interior of the minienvironment 52 is kept at a high degree of cleanness to process a wafer 1. The robot arm 54 of a transport robot for effecting the transport of the wafer 1 is provided in the minienvironment 52. The pod 2 has an opening portion in one surface thereof, and includes a box-shaped main body portion 2a having a cavity space for containing the wafer 1 therein, and a lid 4 for sealing the opening portion. A shelf having a plurality of shelves is disposed in the main body portion 2a. The wafer 1 can be placed on each of the plurality of shelves. Each of the shelves is disposed with a predetermined spacing from the shelf adjacent thereto so that adjacent wafers 1 may not contact with each other.

An access opening 10 is formed in the minienvironment 52 on the load port portion 51 side. The position at which the access opening 10 in the minienvironment 52 is disposed is a position at which the pod 2 fixed onto the stand 53 is right opposed to the opening portion of the pod 2 when it is moved on the load port portion 51 toward the minienvironment 52 side so as to become proximate to the access opening 10.

FIGS. 7A and 7B are enlarged views of an opener 3 in a conventional wafer processing apparatus. The opener 3 is provided near the access opening 10 inside the minienvironment 52. The opener 3 includes a door 6 and a door arm 42 of an elongated shape. A bar extending perpendicularly to the lengthwise direction of the door arm 42 is disposed at one end of the door arm 42. On the other hand, a fixing member 46 having a through-hole is attached to the door 6, and the bar provided at one end of the door arm 42 extends through this hole in the door 6, whereby the door 6 is pivotably fixed to the door arm 42. The other end of the door arm 42 is formed with a hole. The door arm 42 is rotatably supported by this hole being coupled to a hole at the tip end of a rod 37 which is a portion of an air-driven type cylinder 31 by a pivot 40. A through-hole is formed between the aforementioned one end and the other end of the door arm 42, and a pin extends through this hole and a hole in a fixing member 39 fixed to the support member 60 of a movable portion 56 to thereby constitute a fulcrum 41. Accordingly, the door arm 42 is pivotable about the fulcrum 41 by the expansion and contraction of the rod 37 by the driving of the cylinder 31. The fulcrum 41 of the door arm 42 is fixed to the support member 60 provided on an upwardly and downwardly movable portion 56. The door 6 has holding ports 11a and 11b, and can hold the lid 4 of the pod 2 by vacuum absorption. The opener 3 is mounted on the movable portion 56 vertically movable to move up and down the door arm 42 and the door 6 together with each other. The movable portion 56 is vertically movable along the wall surface of the minienvironment 52.

Accordingly, when the processing of the wafer is to be effected, the pod 2 is first disposed on the stand 53 so as to approach the access opening 10, and the lid 4 is held by the door 6. When the rod of the cylinder 31 is then contracted, the door arm 42 is moved about the fulcrum 41 so as to move away from the access opening 10. By this movement, the door 6 is pivotally moved with the lid 4, and the lid 4 is detached from the pod 2. Thereafter, the movable portion 56 is moved downwardly and the lid 4 is transported to a predetermined retracted position.

In the detection of the wafers 1 on the shelves of the rack in the pod 2, it becomes necessary for a detector to scan each shelf at least once while sweeping along a direction in which the wafers 1 are stacked, to thereby effect the detection of the wafers 1. To effect this sweeping movement for detecting the wafers 1, various methods are conceivable. For example, there is a method of providing a detector on a portion of the robot arm 54 and moving the detector by this robot arm 54 to thereby execute the detecting operation. The robot arm 54, however, is a device originally prepared to effect the transport of the wafer 1, and if the robot arm 54 is to effect the detection of the wafer, the robot arm 54 cannot perform the transporting operation for the wafers 1 during the detecting operation, and this leads to the disadvantage that the amount of treated wafers 1 is reduced.

As another method, there is a method of providing a detector on a portion of an opening and closing device for the lid 4 of the pod 2 and detecting the wafer 1 by the detector during the unsealing of the lid 4. FIGS. 7A and 7B show an apparatus adopting this method. In this apparatus, there is provided a mapping frame 5 comprised of a frame member disposed so as to surround the door 6. A pair of bar-like members 13a and 13b are disposed on the upper portion of the mapping frame 5. A transmitting type sensor 9 as a detector is mounted on the tip end of each of these bar-like members 13a and 13b. The transmitting type sensor 9 forms a pair by an emitter 9a and a detector 9b. FIG. 8 is a view of the mapping frame 5 of this apparatus as it is seen from its upper side. As shown in this figure, these bar-like members 13a and 13b have their respective one end fixed for the pivotal movement about shafts 36a and 36b on the mapping frame 5, and are rotated by cylinders 34a and 34b disposed also on the mapping frame 5 and can evolve so as to protrude from the mapping frame 5 toward the interior of the pod 2. That is, when the detecting operation for the wafer 1 is not executed, the bar-like members 13a and 13b are contained so as to be within the width of the mapping frame 5 along the axis of the frame of the mapping frame 5 (a bar-like member 13c and a bar-like member 13d). When the detection of the wafer 1 is to be effected, the bar-like member 13c and the bar-like member 13d are rotated by nearly 90 degrees about shafts 36a and 36b, respectively, by a cylinder 34a and a cylinder 34b and the bar-like members 13a and 13b evolve toward the wafer 1. In this state, the emitter 9a attached to the tip end of the bar-like member 13a and the detector 9b attached to the tip end of the bar-like member 13b become opposed to each other. When the bar-like members 13a and 13b evolve so as to protrude from the mapping frame 5, slots are formed between the emitter 9a and the detector 9b. The emitter 9a and the detector 9b are mounted so that the edge portion of the wafer 1 may be located between these slots. Also, the mapping frame 5 is mounted on the movable portion 56 so as to be moved up and down with the door 6. Further, the mapping frame 5 is supported also by the rod of another cylinder 43 so as to be movable up and down discretely from the door 6.

Reference is now had to FIG. 9 to describe the mapping of a wafer processing apparatus having the wafer mapping function. To carry out mapping in this apparatus, the pod 2 is disposed on the stand 53 so as to be proximate to the access opening 10, and the lid 4 is held by the door 6. When the rod of the cylinder 31 is contracted, the door arm 42 is moved about the fulcrum 41 so as to separate from the access opening 10. Then the door 6 is pivotally moved with the lid 4 and the lid 4 is detached from the pod 2. Here, when the emitter 9a and the detector 9b have evolved, the rod of the cylinder 32 is contracted to a preparatory position in which it becomes insertable into the interior of the pod 2 (a position located from the edge of the opening in the pod 2 to the vertically lower side which is the inner side of the pod 2) to thereby move down the mapping frame 5. After the mapping frame 5 has been moved down to the preparatory position, the cylinder 34a and the cylinder 34b are actuated to thereby evolved the emitter 9a and the detector 9b. Thereupon, the emitter 9a and the detector 9b become inserted into the interior of the pod 2. In this state, as shown in FIG. 8, when the wafer 1 is seen from a direction perpendicular to the surface of the wafer 1, there is brought about such a positional relation that the wafer 1 exists in the slot between the emitter 9a and the detector 9b. When here, the movable portion 56 is moved down, the mapping frame 5 is moved down with the door 6, and the slot between the emitter and the detector crosses the end portion of the wafer 1 to be located when the wafer 1 exists on each of the shelves. The emitter 9a and the detector 9b can scan each shelf of the shelves which sweeping along the direction in which the wafers 1 are stacked, to thereby detect the presence or absence of the wafers 1 and effect mapping.

The above-described method, however, has suffered from the following problems.

(1) The emitter 9a and the detector 9b disposed on the mapping frame 5, in order to prevent them from interfering with the pod 2, are designed to be capable of evolving so as to be rotated by the cylinders 34a and 34b and protrude from the mapping frame 5 toward the interior of the pod 2. The evolving mechanism, including such an air cylinder, is generally liable to produce dust. Further, in this structure, it is necessary that the cylinder 34a and the cylinder 34b be disposed in proximity to the pod 2. This leads to the problem that the dust produced from the cylinder 34a and the cylinder 34b adheres to the wafer 1 and causes the contamination of the wafer 1.

(2) Also, an air-driven type cylinder is used in the operation of opening and closing the door 6, the operation of moving up and down the door 6 and the operation of moving up and down the mapping frame 5. This is for obtaining a force necessary to appropriately crush a seal provided on the lid 4 of the pod 2 to keep the degree of cleanness in the pod. If a driving device for opening and closing the lid is a motor, a great load corresponding to a moment comprising the distance from the fulcrum 41 to the door 6 multiplied by a force necessary to appropriately crush this seal becomes necessary, and this leads to a disadvantageous problem. Accordingly, a driving device for pivotally moving the door 6 and a driving device for retracting the door 6 to a predetermined position are made discrete from each other, and both of them are air-driven type cylinders. In the mapping operation, however, the air-driven type cylinder poses the problem that there cannot be generated a reference signal indicative of the distance over which the emitter 9a and the detector 9b are actually moved, for contrasting with a signal generated when the slot between the emitter 9a and the detector 9b crosses the wafer 1, cannot be generated.

(3) Also, in the opening and closing apparatus of the type as previously described which is provided with a linear motor and in which the opener 3 is opened in a horizontal direction with the door 6, there is the problem that the production of dust from the linear motor cannot be prevented.

SUMMARY OF THE INVENTION

It is an object of the present invention to provide a wafer processing apparatus in which a mechanism for evolving and containing a transmitting type sensor need not be disposed in proximity to a wafer and dust produced from the wafer processing apparatus to evolve and contain the transmitting type sensor during the evolving and containing operation for the transmitting type sensor can be prevented from contaminating the wafer.

It is another object of the present invention to provide a wafer processing apparatus on which a pod is detachably mounted, having an access port through which a wafer is put in and out, the pod having a box having an opening, shelves for taking custody of wafers, and a lid for separably covering the opening, the wafer processing apparatus detecting whether the wafer is present on each of the shelves, the wafer processing apparatus comprising: a door unit including a door capable of holding the lid and for covering the access port; a door arm for pivotally supporting the door near one end thereof; the door arm being supported for pivoted movement about a first fulcrum disposed on a door arm supporting member disposed near the other end of the door arm by the door arm supporting member; and a door opening and closing driver for rotating the door arm about the first fulcrum; a mapping unit including a transmitting type sensor having an emitter and a detector; a mapping frame for holding the emitter and the detector so as to protrude toward the access port, the emitter and the detector being disposed in face-to-face relationship with each other, a slot being formed between the emitter and the detector; a mapping frame arm for supporting the mapping frame near one end thereof, the mapping frame arm being supported for pivotal movement about a second fulcrum disposed on a mapping frame arm supporting member disposed near the other end of the mapping frame arm by the mapping frame arm supporting member; and a mapping frame driver for rotating the mapping frame arm about the second fulcrum; and a movable portion for supporting the door arm supporting member and the mapping frame arm supporting member, and moving the door unit and the mapping frame; wherein the emitter and the detector are moved toward the access port and the opening and are plunged into the pod after the door is opened with the lid by the door unit, and by the movable portion, the slot between the emitter and the detector crosses an end portion of a wafer to be located when a wafer is present on each of the shelves.

The above and other objects of the invention will appear more fully hereinafter from the consideration of the following description taken in connection with the accompanying drawings wherein one example is illustrated by way of example.

BRIEF DESCRIPTION OF THE DRAWINGS

FIG. 2A is an enlarged view of the vicinity of the opener of a wafer processing apparatus according to the present embodiment as it is seen from a side thereof.

FIG. 2B is an enlarged view of the vicinity of the opener of the wafer processing apparatus according to the present embodiment as it is seen from the inside of a minienvironment.

DESCRIPTION OF THE PREFERRED EMBODIMENTS (First Embodiment)

Embodiment 1 will hereinafter be described with reference to the drawings.

Figure 1:
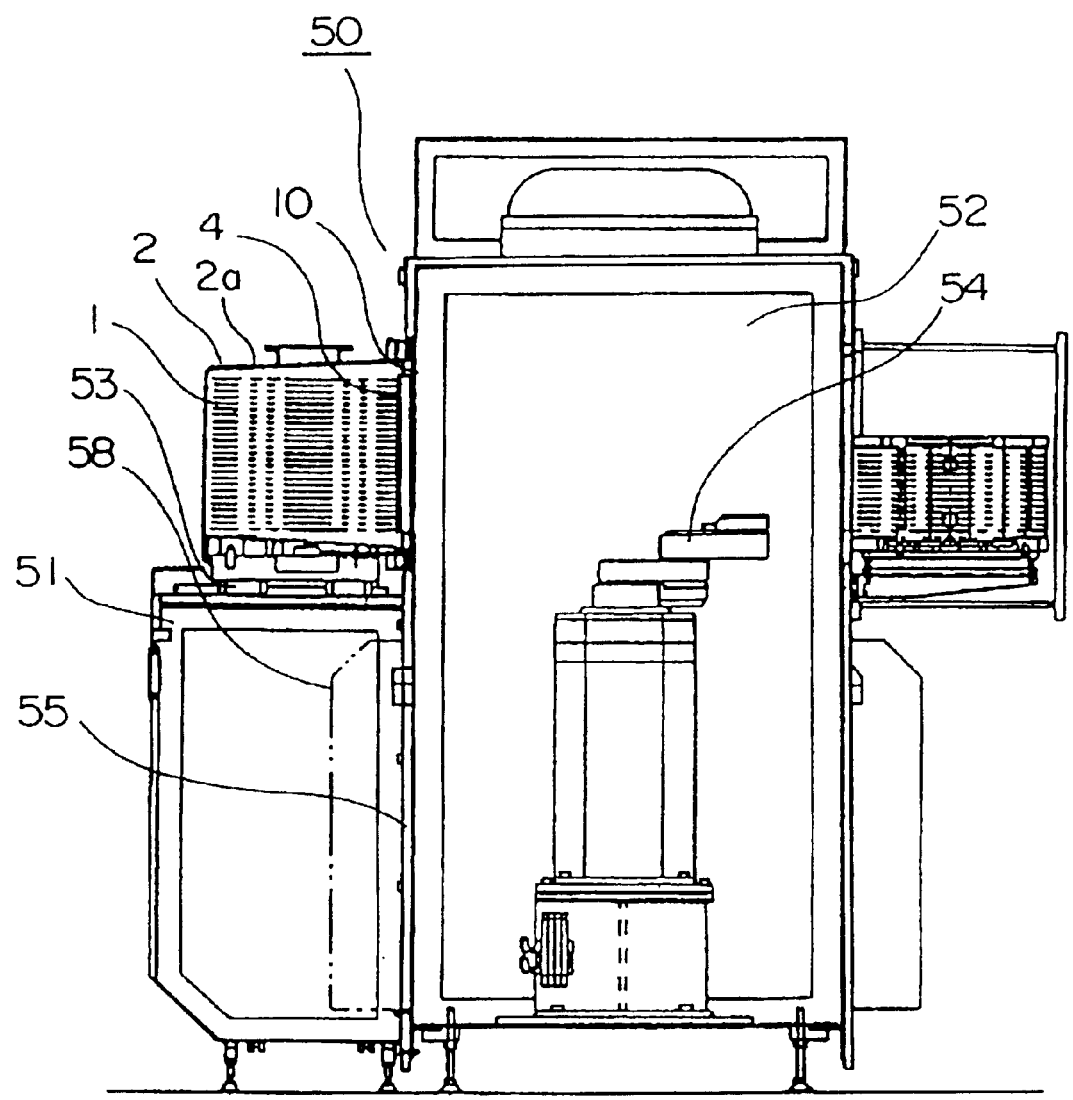
FIG. 1 generally shows a wafer processing apparatus to which the present invention is applied.

FIG. 1 shows the whole of a wafer processing apparatus 50. The wafer processing apparatus 50 is comprised chiefly a load port portion 51 and a minienvironment 52. In the minienvironment 52 of the wafer processing apparatus 50, in order to exhaust dust and keep a high degree of cleanness, a constant air flow is produced from the upper portion toward the lower portion of the minienvironment 52 by a fan (not shown) provided in the upper portion of the minienvironment 52. Thus, the dust is always exhausted downwardly.

The load port portion 51 and the minienvironment 52 are comparted by a partition 55 and a cover 58. A stand 53 for placing a pod 2 thereon is installed on the load port portion 51, and can be moved on the load port portion 51 toward or away from the minienvironment 52.

The pod 2 is provided with a main body 2a which is a box having a space for containing a wafer 1 therein and provided with an opening, and a lid 4 for detachably closing the opening. In the main body 2a, there is disposed a rack having shelves arranged in a predetermined direction. In the present embodiment, this predetermined direction is a vertical direction. A wafer can be placed on each of the shelves. The interior of the minienvironment 52 is kept at a high degree of cleanness to treat the wafer 1.

An access opening 10 somewhat larger than the lid 4 of the pod 2 is formed in the minienvironment 52 on the load port portion 51 side. An opener 3 for opening and closing the lid 4 of the pod 2 is provided on a side of the access opening 10 which is the interior of the minienvironment 52. Also, the robot arm 54 of a transport robot is provided in the interior of the minienvironment 52. After the lid 4 of the pod 2 is opened, the robot arm 54 puts in and out the wafer 1 contained in the pod 2 through an opening in the pod 2 and the access opening 10 to thereby effect predetermined treatment.

The opener 3 will be described here with reference to FIGS. 2A and 2B. FIG. 2A is a magnified view of the load port portion 51, the pod 2, the opener 3 and the lid 4 in FIG. 1, and FIG. 2B is a view of the portions shown in FIG. 2A as they are seen from the inside of the minienvironment 52. The opener 3 is provided with a door 6 and a mapping frame 5. The door 6 is a plate-shaped member of a size which can cover the access opening 10, and the surface thereof is provided with holding portions 11a and 11b which are vacuum intake holes. A surface located on the pod 2 side when the door 6 covers the access opening 10 is such a flat surface as can closely contact with the lid 4. A fixing member 46 having a hole is attached to the door 6. It is fixed by a pivot shaft 45 which is provided on the upper end of a door arm 42 pivotally extending through this hole. A hole is formed in the lower end of the door arm 42, and the door arm 42 is coupled and rotatably supported by a pivot shaft 40 extending through that hole and a hole in the tip end of a rod 37 which is a portion of an air-driven type door opening and closing cylinder 31 which is a driving device for opening and closing the door through a door arm supporting member 70.

A mapping frame 5 is a structure comprising a frame member disposed along the access opening 10 and so as to surround the periphery of the door 6. The mapping frame 5 is mounted on the upper ends of a mapping frame arm 12a and a mapping frame arm 12b extending long in the frame member under it. Holes are formed in the lower ends of the mapping frame arm 12a and the mapping frame arm 12b, and a pivot shaft 44 extends through those holes, a hole in a mapping frame arm supporting member 71, and a hole in the tip end of a rod 38 which is a portion of an air-driven type mapping frame driving cylinder 35 which is a mapping frame driving device, whereby the two mapping frame arms are coupled together and rotatably supported. The mapping frame arm 12a and the mapping frame arm 12b extend symmetrically and in parallel to each other along the center axis of the mapping frame 5 and in a vertical direction to equally support a load. A rod 47 perpendicular to each of the mapping frame arm 12a and the mapping frame arm 12b is mounted between the upper ends and lower ends of the mapping frame arm 12a and the mapping frame arm 12b. A fixing member 39 which is a fulcrum supporting portion of a shape extending perpendicularly from a support member 60 is disposed on the support member 60. The fixing member 39 has a through-hole parallel to the support member 60. A bearing (not shown) is disposed in the through-hole in the fixing member 39, and the outer ring of the bearing is fitted to the inner wall of the through-hole, and the inner ring of the bearing pivotally supports the rod 47. Thereby, the rod 47 constitutes a fulcrum 41 in a state in which it is contained in the through-hole in fixing member 39.

This fulcrum 41 is constituted as a coaxial fulcrum serving as the fulcrum of the mapping frames 12a and 12b and the fulcrum of the door arm in common. That is a discrete through-hole is formed between the upper end and lower end of the door arm 42. The rod 47 extends through this through-hole and constitutes the fulcrum 41.

The door arm 42 is pivotally movable about the fulcrum 41 by the expansion and contraction of the rod 37 by the driving of the cylinder 31. The fulcrum 41 of the door arm 42 is fixed to the support member 60 provided on an upwardly and downwardly movable portion 56. The door 6 has holding ports 11a and 11b, and can hold the lid 4 of the pod 2 by vacuum absorption. The door arm 42 is disposed so as to be substantially vertical when the door 6 is urged against the access opening 10 (hereinafter referred to as waiting state), and the door arm 42 is rotated, whereby the door 6 is moved away from the wall surface of the minienvironment 52.

By the expansion and contraction of the rod 38 by the driving of the mapping frame driving cylinder 35, the mapping frame arm 12 is pivotally movable about the fulcrum 41. That is, the mapping frame arm 12 is also fixed to the support member 60 provided on the upwardly and downwardly movable portion 56. The mapping frame 5 is disposed so as to be inclined with separating from the wall surface of the minienvironment 52 when the door 6 is in its waiting state. That is, in this state, the mapping frame arm 12a and the mapping frame arm 12b are supported in a state in which they are inclined so as to have a certain angle with respect to the door arm 42, and the upper portion of the mapping frame 5 is spaced apart by a predetermined distance from the wall surface of the minienvironment 52. On the other hand, when from this waiting state, the mapping frame 5 rotates the mapping frame arm 12a and the mapping frame arm 12b in a direction to abut against the wall surface of the minienvironment 52, the mapping frame 5 substantially abuts against the wall surface of the minienvironment 52. A sensor supporting bar 13a and a sensor supporting bar 13b are fixed to a frame member disposed in the upper portion of the mapping frame 5 so as to protrude toward the wall surface of the minienvironment 52. The emitter 9a and detector 9b of transmitting type sensor 9 which is a first transmitting type sensor are attached to the tip ends of the sensor supporting bar 13a and the sensor supporting bar 13b, respectively, in opposed relationship with each other and so as to form a slot therebetween.

Figure 3A:
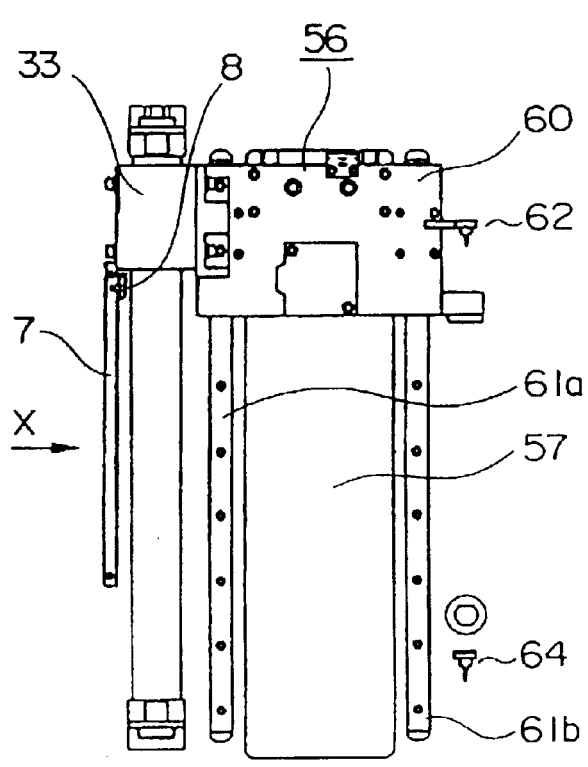
FIG. 3A is a front view of the movable portion of the opener of a wafer processing apparatus according to Embodiment 1 as it is seen from a load port side.
Figure 3B:
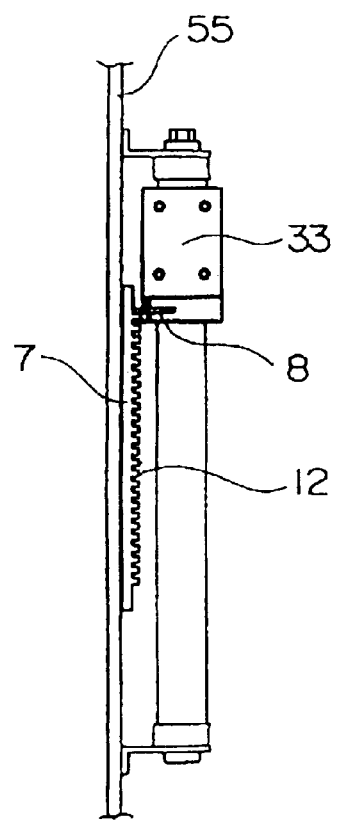
FIG. 3B is a view of the movable portion of the opener of the wafer processing apparatus according to Embodiment 1 as it is seen from a side thereof.

The wafer processing apparatus 50 is provided with a movable portion 56 for moving up and down the opener 3. FIG. 3A is a view of the movable portion 56 of the opener 3 as it is seen from the load port portion 51 side, and FIG. 3B is a view taken along the arrow X of FIG. 3A. The movable portion 56 is provided with an air-driven type rodless cylinder 33 for effecting vertical movement and a support member 60, and is disposed below the underside of the pod 2 so as to be downstream of the pod 2 with respect to an air flow. The fixing member 39, the air-driven type cylinder 31 and the cylinder 35 are mounted on the support member 60. The movable portion 56 is provided on the load port portion 51 side, and supports the opener 3 on the minienvironment 52 side from a slot 57 formed in a partition 55 by the door arm 42, the mapping frame arm 12a and the mapping frame arm 12b. The slot 57 is formed with the direction of movement of the movable portion 56, i.e., in the case of the present embodiment, the vertical direction, as the lengthwise direction. The load port portion 51 and the minienvironment 52 are partitioned by a cover 58 so that the degree of cleanness in the minienvironment 52 may not be lowered by the slot 57. Further, a limiter 59 for preventing the overrun of the opener 3 when the opener 3 is moved down is provided below a partition 55. The partition 55 is provided with the rodless cylinder 33, a guide 61a and a guide 61b along the slot 57. The movable portion 56 effects upward and downward movement along the guide 61a and the guide 61b by the rodless cylinder 33. A timing plate 7 is provided sideways of the movable portion 56 along the rodless cylinder 33.

The timing plate 7 is a plate-shaped member extending in a direction along the rodless cylinder 33, and has in the lengthwise direction thereof index means disposed at predetermined intervals. In the present embodiment, the timing plate has notches as the index means having a certain width and disposed at predetermined intervals to form an uneven portion 12. The member of the uneven portions corresponds to the number of the shelves of the wafer arranging shelf in the pod, and the uneven portions are disposed so that when the movable portion comes to any shelf, a notch corresponds thereto without fail. In the movable portion 56 on the timing plate 7 side, a transmitting type sensor 8 which is a second transmitting type sensor is fixed onto the lateral partition 55. The emitter and detector of the transmitting type sensor 8 are disposed in opposed relationship with each other and slots are formed therebetween. The emitter and detector of the transmitting type sensor 8 are disposed so that the uneven portions 12 provided with notches at predetermined intervals provided on the timing plate 7 may be interposed among the slots of the transmitting type sensor 8, and the uneven portions 12 of the timing plate 7 can be detected in conformity with the movement of the movable portion 56.

A transmitting type sensor 62 is provided on the support member 60 of the movable portion 56, and a limiter 64 is provided on the partition 55 near the lower side of the slot 57. Design is made such that when a protruding portion 62 intercepts light from the limiter 64, a stop signal is outputted to the movable portion and the movement of the whole of the opener 3 is stopped.

Figure 4:
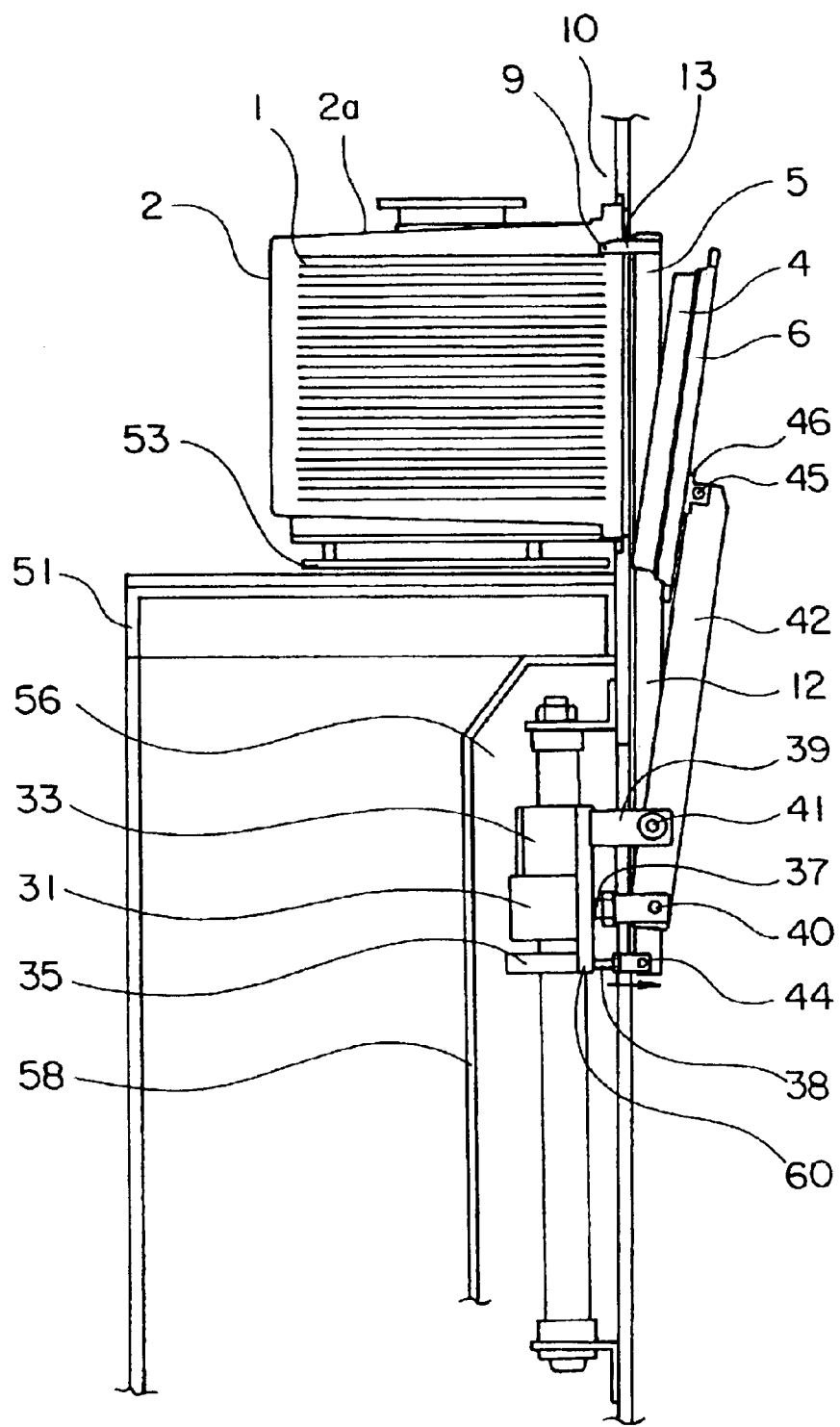
FIG. 4 is a view showing the sequence of the mapping of a wafer, and shows a state when the mapping preparation has been completed.
Figure 5:
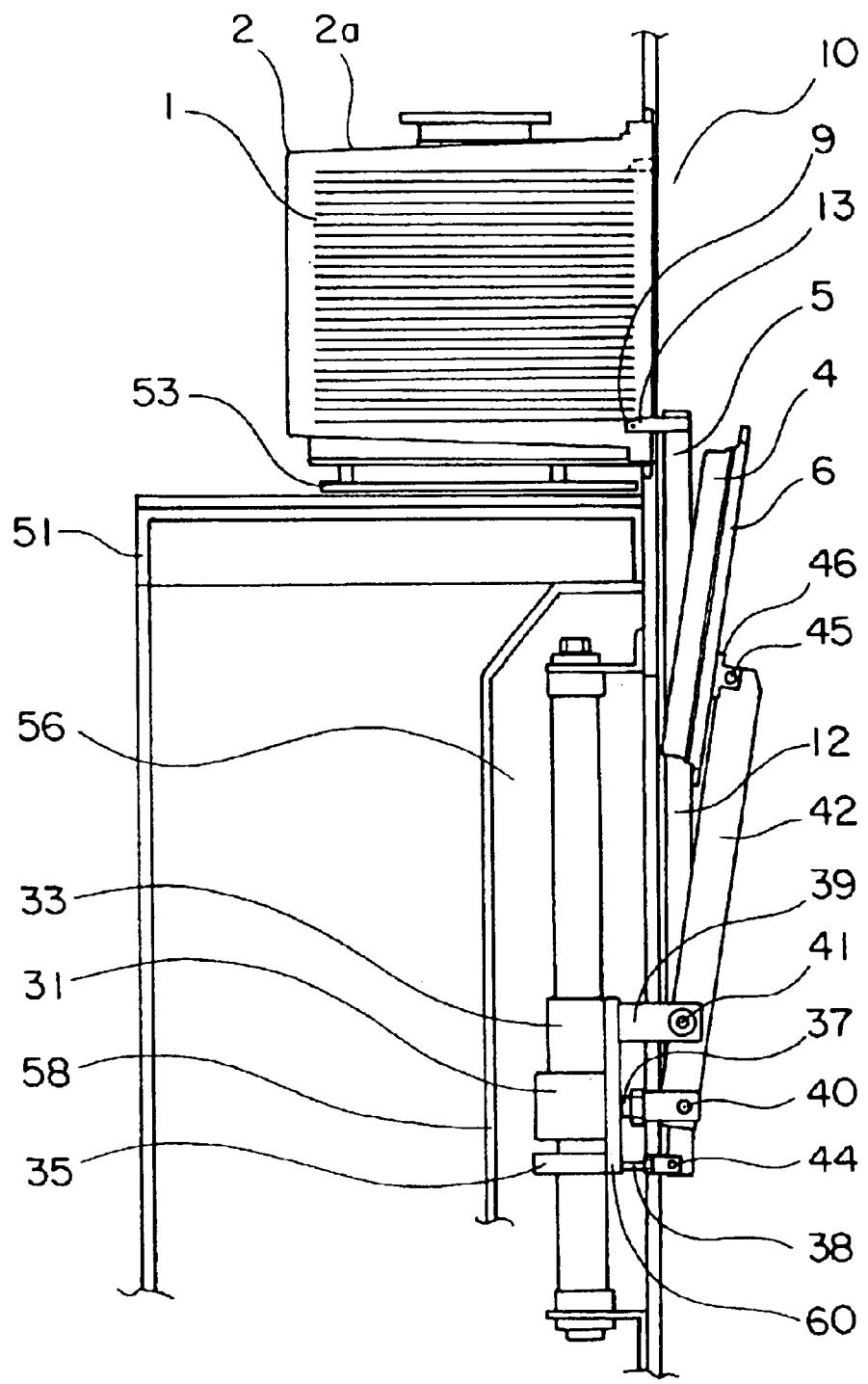
FIG. 5 is a view showing the sequence of the mapping of the wafer, and shows a state when the mapping operation has been completed.
Figure 6:
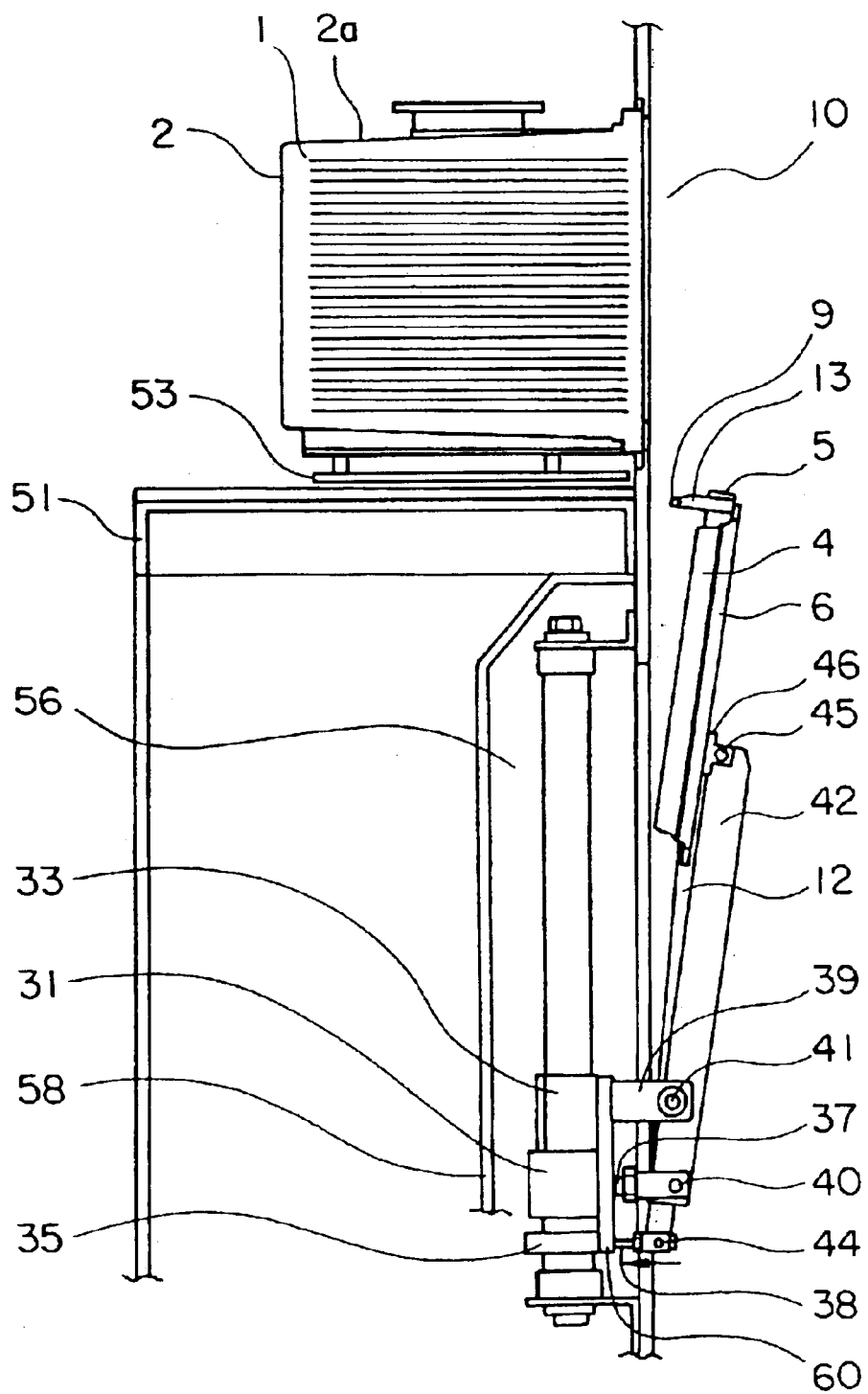
FIG. 6 is a view showing the sequence of the mapping of the wafer, and shows a state when all of the mapping and the opening operation of a lid have been completed.
Figure 7A:
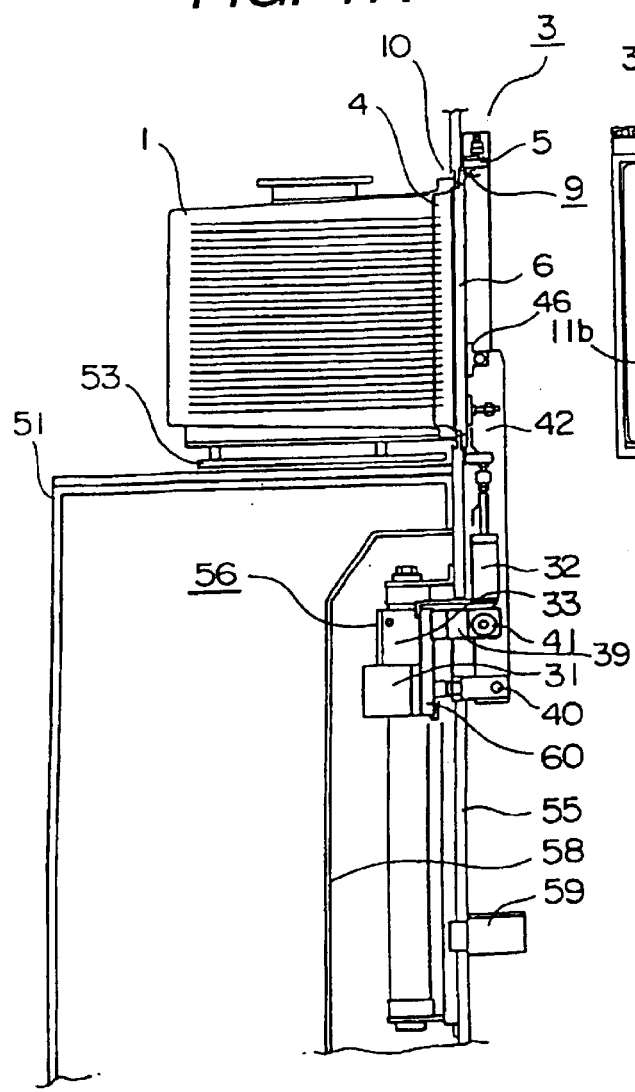
FIG. 7A is an enlarged view of the vicinity of the opener of a conventional wafer processing apparatus as it is seen from a side thereof.
Figure 7B:
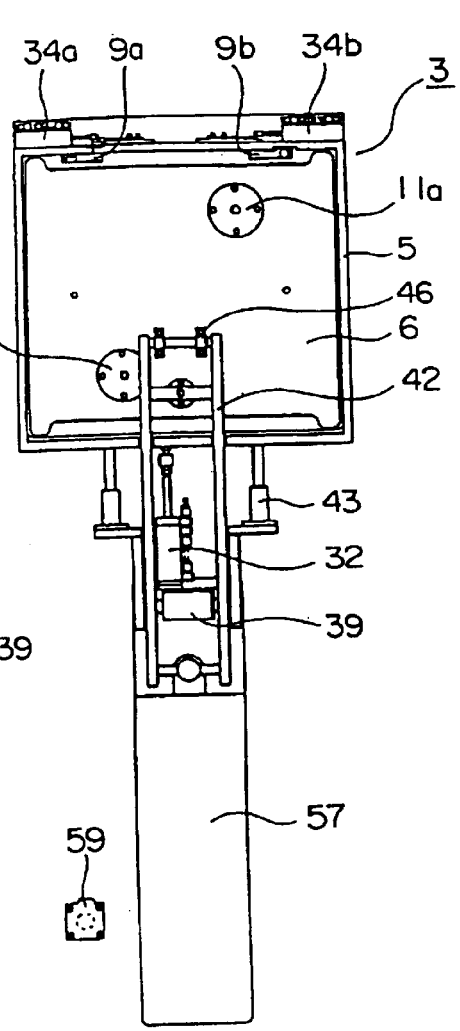
FIG. 7B is an enlarged view of the vicinity of the opener of the conventional wafer processing apparatus as it is seen from the inside of a minienvironment.

Reference is now had to FIGS. 2A and 2B and FIGS. 4 to 6 to describe how the detection of the wafer 1 for the mapping of the wafer 1 is effected on the basis of these constructions. FIGS. 2A and 2B show a waiting state, FIG. 4 shows a state in which the lid 4 is opened and closed and the mapping frame 5 is operated, FIG. 5 shows a state in which the detection of the wafer 1 has been completed, and FIG. 6 shows a state in which the mapping frame 5 has been returned to the waiting state after the completion of the detection of the wafer 1.

Wafers 1 which have satisfied the treatment standard of pre-treatment are contained in the shelf in the pod 2 which has terminated the preceding treating process, while on the other hand, wafers 1 which have not satisfied the standard are eliminated from the process at the stage of the pre-treatment. In the shelf for the wafers 1, there are mixedly present shelves on which the wafers 1 are present and shelves on which the wafers 1 are not present. The pod 2 in this state, as shown in FIGS. 2A and 2B, is placed on the stand 53 on the minienvironment 52 and is moved so as to approach the access opening 10.

In this state, the opener 3 is in the waiting state. That is, the rod 37 of the cylinder 31 for opening and closing the door is in its most expanded state and the door arm 42 is in a state in which it urges the door 6 against the access opening 10 about the fulcrum 41 to thereby cover the access opening. In the present embodiment, in this state, the arm 42 is in its vertically erect state. On the other hand, the rod 38 of the mapping frame driving cylinder 35 is in its most contracted state and the mapping frame arms 12a and 12b are in a state in which they act to pull the mapping frame 5 apart from the wall surface of the minienvironment 52 about the fulcrum 41. That is, in the present embodiment, the mapping frame arms 12a and 12b are in an oblique state at a certain angle with respect to the door arm 42.

FIG. 4 shows a state in which the pod 2 becomes proximate to the access opening 10 and the door 6 holds the lid 4. When the pod 2 becomes proximate to the access opening 10, the lid 4 of the pod 2 comes into close contact with the door 6, and the door 6 effects the holding of the lid 4 of the pod 2 from holding portions 11a and 11b by vacuum suction. When the door 6 holds the lid 4, the cylinder 31 for opening and closing the door works to contract the rod 37.

Thereupon the door arm 42 pulls a pivot shaft 40 provided on the end portion of the door arm 42 toward a support base 60 side, and is pivotally moved by the fulcrum 41 so as to pull the door 6 apart from the access opening 10 in accordance with the principle of the lever, and opens the lid 4 from the pod 2.

Figure 8:
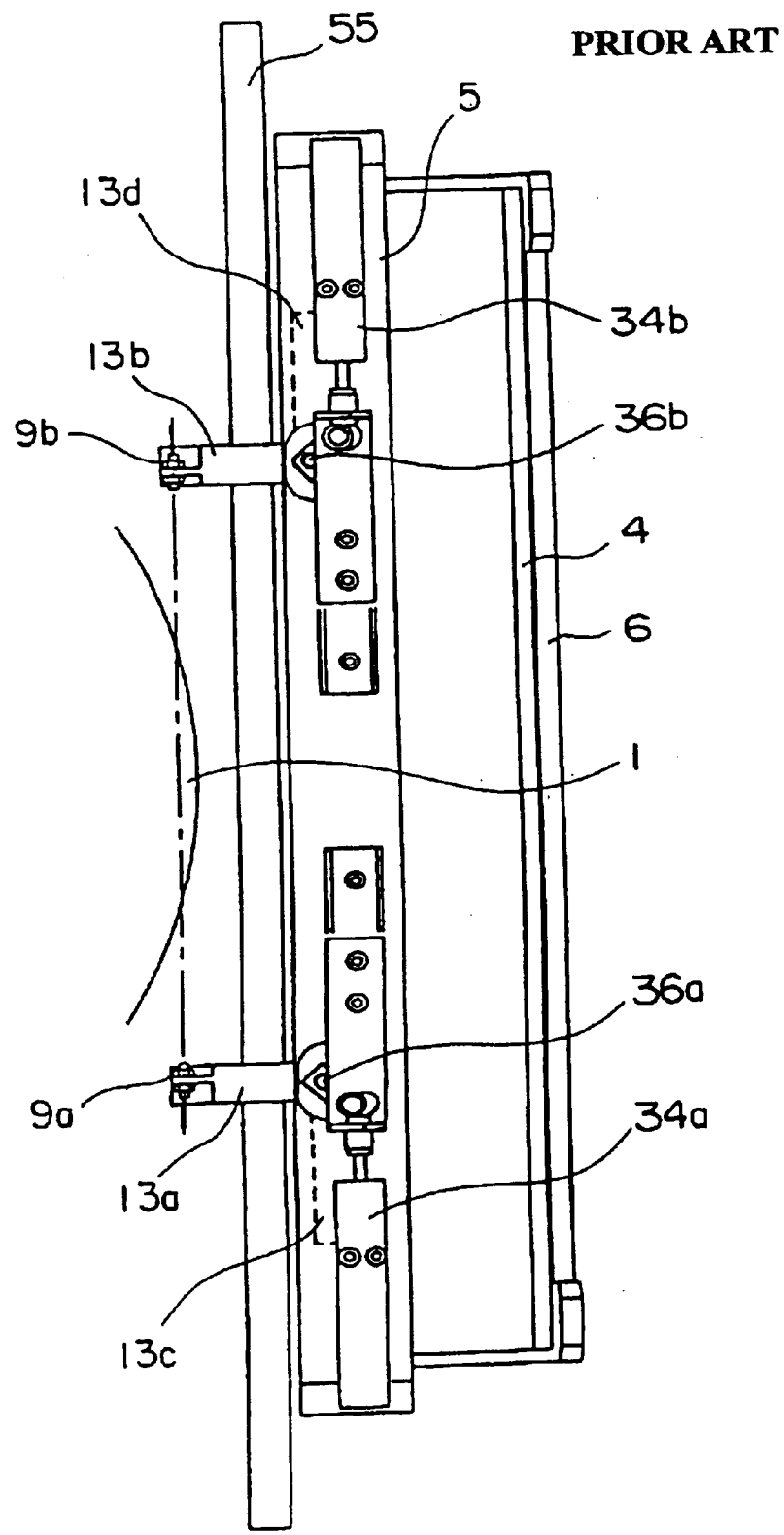
FIG. 8 shows the transmitting type sensor portion of the conventional wafer processing apparatus.
Figure 9:
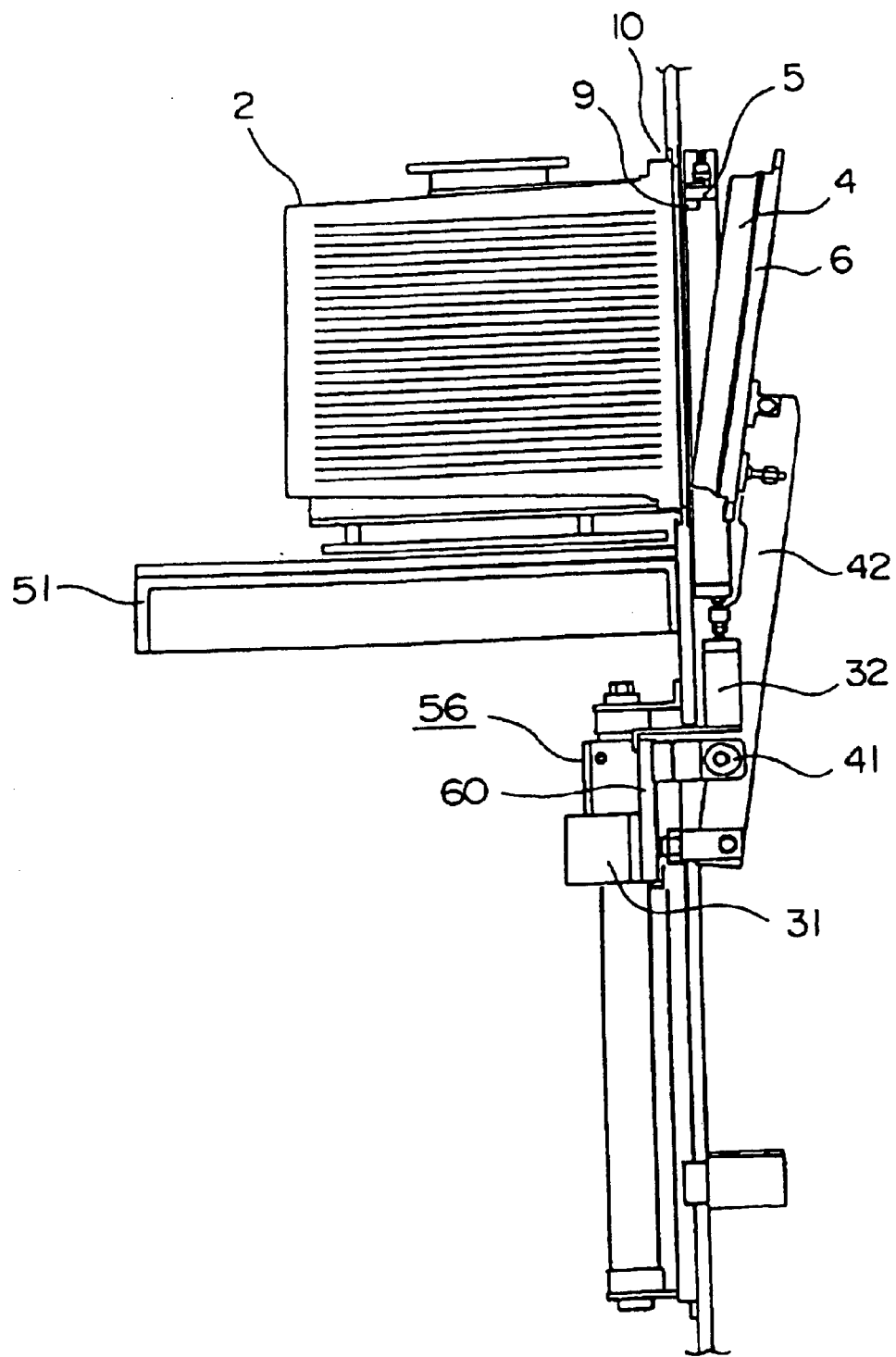
FIG. 9 shows the details of the operation of a mapping frame provided with the transmitting type sensor of the conventional wafer processing apparatus.

Assuming that the mapping frame arms 12 are pivotally moved after the lid 4 has been opened, the movable portion 56 is slightly moved down to a position on which the upper end of the mapping frame 5 enters the position of the access opening 10. After the termination of this downward movement, the mapping frame arms 12 actually start their pivotal movement. That is, the mapping frame arms 12 are pivotally moved until the rod 38 of the mapping frame driving cylinder 35 is expanded and the mapping frame 5 substantially abuts against the periphery of the access opening 10. Thereupon the transmitting type sensor 9 attached to the upper side of the mapping frame 5 comes out of the access opening 10 and is inserted into the pod 2. At this point of time, the emitter 9a and the detector 9b, like the conventional transmitting type sensor 9 as shown in FIG. 8, constitute a slot which is a detection space with the wafer 1 lying on a straight line linking the emitter 9a and the detector 9b together.

When in this state, the movable portion 56 is vertically moved, mapping is executed. That is, the opener 3 is moved down to a position shown in FIG. 5 by the rodless cylinder 33. The emitter 9a and the detector 9b are moved down in a direction perpendicular to the surface of the wafer 1 with the movable portion 56 and the opener 3 and therefore, when the wafer 1 is present on a shelf of the shelves, light emitted from the emitter 9a is intercepted, and when the wafer 1 is absent on the shelf, the light of the emitter 9a is not intercepted.

If design is made such that the detector 9b generates a non-transmission signal when it is interrupted by the wafer 1, and the detector 9b generates a transmission signal when it is not interrupted by the wafer 1, it can be judged that when the non-transmission signal is detected, the wafer 1 is present, and it can be judged that when the transmission signal is detected, the wafer 1 is absent. Further, as will hereinafter be described, general judgment is effected with a signal indicative of the position of the wafer 1 added thereto.

The emitter and detector of the transmitting type sensor 8 are disposed so as to have interposed therebetween the uneven portions 12 which are cutaways at predetermined intervals which are index means provided on the timing plate 7 and therefore, when the movable portion 56 is moved down, the transmitting type sensor 8 is also moved down therewith and detects the uneven portions 12 of the timing plate 7. Design is made such that when at this time, the transmitting type sensor 8 passes a notched portion, the light from the emitter of the transmitting type sensor 8 is not intercepted, but is sensed by the detector to thereby generate a transmission signal, and when the transmitting type sensor 8 passes an un-notched portion, the light from the emitter of the transmitting type sensor 8 is intercepted and is not detected by the detector to thereby generate a non-transmission signal. Accordingly, if the uneven portions 12 of the timing plate 7 are preset so that the point of time at which the emitter and detector of the transmitting type sensor 9 pass each shelf of the shelves in the pod 2 and point of time at which the emitter and detector of the transmitting type sensor 8 pass the notched portion may correspond to each other, the transmission or non-transmission signal detected by the transmitting type sensor 8 is indicative of the signal of a shelf of the shelves which the transmitting type sensor 9 actually passes. If this is compared with the result of the detection of the transmission or non-transmission signal detected as a result of the transmitting type sensor 9 having its light intercepted by the wafer 1 and when the transmitting type sensor 8 detects a signal corresponding to a shelf of the shelves, the transmitting type sensor 9 has its light intercepted, it can be judged that the wafer 1 is present on that shelf, and if at that time, the transmitting type sensor 9 has its light not intercepted, it can be judged that the wafer 1 is absent on that shelf. This detecting operation is executed for all wafers 1, and when the detection terminating position of the opener 3 shown in FIG. 5 is reached, the detecting operation is completed.

Of course, an un-notched portion can also be index means having a certain width and disposed at predetermined intervals.

Thereafter, the rod 38 of the cylinder 35 for opening and closing the mapping frame is again contracted, whereupon the mapping frame arms 12 are pivotally moved and the mapping frame 5 is moved away from the access opening 10. When the rod 38 is most contracted the movement of the mapping frame 5 is completed. The movable portion 56 is then moved to the lowest point, thus opening the lid 4 and completely a series of detecting operations for the mapping of the wafer 1. This state is the state shown in FIG. 5.

As described above, the emitter and detector of the transmitting type sensor 9 are fixed to the mapping frame, and provision is made of the mapping frame arms 12 and the mapping frame driving cylinder which are means for pivotally moving the mapping frame 5, and further these devices are provided on the movable portion 56 sufficiently spaced apart from the access opening 10, whereby it has become unnecessary to provide a device for performing the evolving operation of the transmitting type sensor near the wafer 1.

Also, by utilizing the timing plate 7 and the transmitting type sensor 8, a synchronizing signal corresponding to a shelf of the shelves in the pod 2 can be easily generated and therefore, even if a drive motor is not used as a driving device, the accurate mapping of the wafer 1 becomes possible. If the timing plate 7 is thus utilized, an air-driven type cylinder which cannot generate a signal can be utilized for the mapping of the wafer 1.

While in the present embodiment, the shelves are disposed so as to be arranged vertically and the movable portion 56 is vertically moved up and down and the mapping frame 5 is a structure comprising a frame member disposed along the access opening 10 and so as to surround the door 6, the same effect is achieved as long as the direction in which the shelves are arranged and the direction in which the movable portion 56 is moved are substantially the same and the mapping frame 5 has a member on which a pair of transmitting type sensors 9 can be disposed so that a line linking the pair of transmitting type sensors 9 together on the starting point side of the movement of the movable portion 56 may cross the semiconductor wafer placed on a shelf of the shelves. That is, the mapping frame can achieve a similar effect if as in the present embodiment, the shelves are disposed so as to be arranged vertically and a pair of transmitting type sensors 9 can be disposed above the door so that when the movable portion 56 is vertically moved up and down, a line linking the pair of transmitting type sensors 9 together may cross the semiconductor wafer placed on a shelf of the shelves.

Also, while in the present embodiment, the fulcrum of the door arm 42 and the fulcrum of the mapping frame 5 are made common to each other by the fulcrum 41, a similar effect will be achieved even if the two fulcrums are made discrete from each other. That is, an effect similar to that of the present invention will be achieved even if different fulcrums are provided as a first fulcrum to be provided on the door arm 42 and a second fulcrum to be provided on the mapping frame.

While in the present embodiment, the movable portion 56, the fulcrum 41, the cylinder 31 for opening and closing the door and the mapping frame driving cylinder 35 are made integral with one another, they need not always be made integral with one another in obtaining the effect of the present invention. A similar effect will be achieved as long as these mechanisms are disposed downstream of the pod 2 with respect to the air flow.

Figure 10:
FIG. 10 shows the arrangement of the emitter and the detector of the transmitting type sensor with regard to the wafer placed on a shelf.

Furthermore, in theory, the emitter 9a and the detector 9b can be arranged so that the light beam (a center of the light beam) from the emitter 9a to the detector 9b is parallel to the surface of the wafer placed on each shelf. In practice, however, as shown in FIG. 10, the emitter 9a and the detector 9b should be arranged with an angle to the surface of the wafer placed on each shelf. This is because the light beam from the emitter 9a diffusely reflects by the surface of the wafer on a shelf. That is, in order to avoid the diffuse reflection, the emitter 9a and the detector 9b may be arranged so that the light beam from the emitter 9a to the detector 9b is inclined with an angle to the surface of the wafer placed on each shelf. Preferably, the angle should be substantially 1 degree.

An actual solid angle of the light beam from the emitter 9a is about 2 degree. If the emitter 9a and the detector 9b are arranged so that the light beam from the emitter 9a to the detector 9b is parallel to the surface of the wafer placed on each shelf, the light beam diffusely reflects on the surface of the wafer and reach the detector 9b even though the direct light beam from the emitter 9a is blocked by the wafer. In this case, ever though the wafer should be detected, the detector 9b cannot detect the wafer since the detector receives the diffuse reflection from the wafer. Therefore, if the emitter 9a and the detector 9b are arranged with an angle of about 1 degree to the surface of the wafer placed on each shelf, it can avoid causing the diffuse reflection from the wafer.

(Second Embodiment)

In Embodiment 1, a magnetic fluid seal is disposed in such a state in which the rod 47 extends through the opposite end portions of the through-hole in the fixing member 39, whereby dust produced from the pivotally movable portion can be prevented from being outputted to the outside to thereby further prevent the contamination by the dust. Embodiment 2 will hereinafter be described.

Magnetic fluid seals 48a and 48b attached to the opposite end portions of the through-hole in the fixing member 39 in such a state that the rod 47 extends therethrough. Each of the magnetic fluid seal 48a and the magnetic fluid seal 48b is of structure in which a magnetic member (e.g., a ferrite magnet) is sandwiched between two annular thin plates. Further, when a magnetic fluid is interposed between these plates, this magnetic fluid is held between these plates by the magnetic force of the ferrite magnet, and the held magnetic fluid is held in the gap with respect to an object to be sealed by surface tension. As a result, film of the magnetic fluid is forcibly forced on the magnetic fluid seals to thereby achieve sealing. In the present apparatus, film of oil including a magnetic material is disposed so as to be formed between the peripheral surface of the rod 47 and the magnetic fluid seals 48a and 48b. Thereby, dust produced from the rod 47 which is a rotary shaft constituting the fulcrum 41 can be prevented.

Of course, Embodiment 2 can be applied to Embodiment 1, and can be applied not only to the fulcrum 41 for opening and closing the mapping frame 5 and the door 6, but also to the whole of the pivotally movable portion. Accordingly, the magnetic fluid seal can be applied to the whole of the pivotally movable portion in spite of the fact that in the wafer processing apparatus, there is an air flow flowing from the upper portion toward the lower portion of the apparatus and that the first fulcrum and the second fulcrum are located below the underside of the pod.

While the invention has particularly been shown and described with respect to the preferred embodiments thereof, it will be understood by those skilled in the art that the foregoing and other changes in form and details can be made therein without departing from the spirit and scope of the invention.

What is claimed is:

1. A wafer processing apparatus on which a pod is detachably mounted, having an access port through which a wafer is put in and out, the pod having a box having an opening, shelves for taking custody of wafers, and a lid for separably covering the opening, the wafer processing apparatus detecting whether the wafer is present on each of the shelves, the wafer processing apparatus comprising:

a door unit, comprising:
   a door configured to hold the lid and to cover the access port;
   a door arm configured to pivotally support the door near one end thereof, the door arm being supported for pivotal movement about a first fulcrum by a door arm supporting member, the first fulcrum being disposed on the door arm supporting member near the other end of the door arm; and
   a door opening and closing driver for rotating the door arm about the first fulcrum;

a mapping unit, comprising:
   a first transmitting sensor having a first emitter and a first detector;
   a mapping frame configured to hold the emitter and the first detector so as to protrude toward the access port, the first emitter and the first detector being disposed in face-to-face relationship with each other forming a slot;
   a mapping frame arm for supporting the mapping frame near one end thereof, the mapping frame arm being supported for pivotal movement about a second fulcrum by a mapping frame arm supporting member, the second fulcrum being disposed on the mapping frame arm supporting member near the other end of the mapping frame arm; and
   a mapping frame driver for rotating the mapping frame arm about the second fulcrum; and a movable portion configured to support the door arm supporting member and the mapping frame arm supporting member and to move the door unit and the mapping frame, wherein the first emitter and the first detector are moved toward the access port and the opening and are plunged into the pod after the door is opened with the lid by the door unit, and, by a movement of the movable portion, the slot between the first emitter and the first detector crosses an edge portion of the wafer to be located when the wafer is present on each of the shelves.

2. A wafer processing apparatus according to claim 1, wherein an air flow is provided flowing from an upper side toward a lower side of the wafer processing apparatus, the movable portion is movable upward and downward in a vertical direction, the movable portion is moved downward to a preparatory position in which the first emitter and the first detector are located below an edge of the opening in the pod when the mapping frame arm is pivotally moved about the second fulcrum after the door has been opened with the lid by the door unit, and, after the movable portion has been moved to the preparatory position, the mapping frame arm is pivotally moved about the second fulcrum in order to plunge the first emitter and the first detector into the interior of the pod.

3. A wafer processing apparatus according to claim 1, further comprising:
   a timing plate having index means disposed at predetermined intervals; and
   a second transmitting sensor having a second emitter and a second detecter, the second transmitting sensor being disposed so that the index means is arranged between the second emitter and the second detector.

4. A wafer processing apparatus according to claim 3, wherein as the second emitter and the second detector of the second transmitting sensor passes the index means, the slot between the first emitter and the first detector of the first transmitting sensor crosses an end portion of the wafer.

5. A wafer processing apparatus according to claim 4, wherein the index means is a notched portion.

6. A wafer processing apparatus according to claim 4, wherein the index means is an un-notched portion.

7. A wafer processing apparatus according to claim 1, wherein the door opening and closing driver and the mapping frame driver are placed on the movable portion.

8. A wafer processing apparatus according to claim 1, wherein the mapping frame arm has a rod, the mapping frame arm supporting member has a through-hole, the rod is fitted in the through-hole and is pivotally supported, whereby the mapping frame arm is supported for pivotal movement about the second fulcrum, and magnetic fluid seals are provided in the gaps between the rod and the through-hole substantially at the opposite ends of the through-hole.

9. A wafer processing apparatus according to claim 1, wherein an air flow from an upper side toward a lower side of the wafer processing apparatus is provided, and the door arm supporting member and the mapping frame arm supporting member are located downstream of the opening in the pod with respect to the air flow.

10. A wafer processing apparatus according to claim 9, wherein the door arm supporting member and the mapping frame arm supporting member are located below an underside of the pod.

11. A wafer processing apparatus according to claim 1, wherein an air flow from an upper side toward a lower side of the wafer processing apparatus is provided, and the door opening and closing driver and the mapping frame driver located downstream of the opening in the pod with respect to the air flow.

12. A wafer processing apparatus according to claim 11, wherein the door opening and closing driver and the mapping frame driver are located below an underside of the pod.

13. A wafer processing apparatus according to claim 1, wherein the first emitter and first detector are arranged so that a light beam from the first emitter to the first detector is inclined in an angle to a surface of the wafer.

14. A wafer mapping apparatus for determining whether a wafer is present or not on shelves of a box of a pod having an opening to facilitate taking custody of the wafer, the opening having a lid fixed to a wafer processing apparatus, the lid being configured to separably cover the opening, said wafer mapping apparatus comprising:

a mapping frame;

a pair of transmitting sensors mounted to said mapping frame;

a mapping frame arm having at least first and second end portions, said mapping frame being fixed to said mapping frame arm at the first end portion and said mapping frame arm being pivotal about a fulcrum provided at the second end portion;

a mapping frame drive unit connected to said mapping frame arm, said mapping frame drive unit being configured to move said mapping frame toward a predetermined direction pivotally about said fulcrum together with said mapping frame arm; and a movable portion configured to support and move along a vertical direction said mapping frame, mapping frame arm, and said mapping frame drive device, wherein said pair of transmitting sensors is plunged into said box through said opening by a movement of said mapping frame and is moved along the vertical direction within said box in accordance with a vertical movement of said movable portion.

15. A wafer mapping apparatus according to claim 14, wherein said fulcrum is located below an underside of a lower end portion of said opening.

16. A wafer mapping apparatus according to claim 15, wherein said fulcrum is formed by pivotally fitting a horizontally elongated rod provided at a lower end of said mapping frame arm into a through-hole provided on said movable portion, both ends of said through-hole being configured to support said rod through magnetic fluid seals.

17. A wafer mapping apparatus according to claim 15, further comprising:

a timing plate having index means disposed at predetermined intervals; and a second transmitting sensor provided so as to sandwich the index means therebetween, wherein said index means are formed in accordance with said shelves of said box.

18. A wafer mapping apparatus according to claim 14, wherein said fulcrum is formed by pivotally fitting a horizontally elongated rod provided at a lower end of said mapping frame arm into a through-hole provided on said movable portion, both ends of said through-hole being configured to support said rod through magnetic fluid seals.

19. A wafer mapping apparatus according to claim 18, further comprising:

a timing plate having index means disposed at predetermined intervals; and a second transmitting sensor provided so as to sandwich the index means therebetween, wherein said index means are formed in accordance with said shelves of said box.

20. A wafer mapping apparatus according to claim 14, further comprising:

a timing plate having index means disposed at predetermined intervals; and a second transmitting sensor provided so as to sandwich the index means therebetween, wherein said index means are formed in accordance with said shelves of said box.

* * * * *